(12) United States Patent
Hwang et al.

(10) Patent No.: US 9,966,357 B2
(45) Date of Patent: May 8, 2018

(54) PICK-AND-PLACE TOOL FOR PACKAGING PROCESS

(71) Applicant: Taiwan Semiconductor Manufacturing Company, Ltd., Hsin-Chu (TW)

(72) Inventors: Chien Ling Hwang, Hsin-Chu (TW); Ying-Jui Huang, Zhubei (TW); Yi-Li Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/811,466

(22) Filed: Jul. 28, 2015

(65) Prior Publication Data

US 2015/0333033 A1   Nov. 19, 2015

Related U.S. Application Data

(63) Continuation of application No. 14/040,004, filed on Sep. 27, 2013, now Pat. No. 9,105,760, which is a
(Continued)

(51) Int. Cl.
*B23K 1/00* (2006.01)
*H01L 23/00* (2006.01)
(Continued)

(52) U.S. Cl.
CPC ............ *H01L 24/97* (2013.01); *B23K 1/0016* (2013.01); *B23K 1/203* (2013.01); *B23K 3/047* (2013.01);
(Continued)

(58) Field of Classification Search
CPC ..... H01L 21/67144; H01L 2224/75753; H01L 2224/7565; H01L 2224/75745; H01L 2224/75822; H01L 24/74; H01L 21/68; H01L 2224/75842; H01L 2224/759; H01L 2224/81024; B23K 1/0016; B23K 1/203
(Continued)

(56) References Cited

U.S. PATENT DOCUMENTS 4,872,258 A   10/1989   Ragard
6,238,515 B1   5/2001   Tsujimoto et al.
(Continued)

FOREIGN PATENT DOCUMENTS

CN   1911762 A   2/2007
EP   0982762 A2   3/2000
(Continued)

*Primary Examiner* — Erin B Saad
(74) *Attorney, Agent, or Firm* — Slater Matsil, LLP

(57) ABSTRACT

A method includes moving a first bond head along a first guide apparatus for a first loop. The first guide apparatus is configured in a ring shape. The method also includes picking up a first die using the first bond head during the first loop, and aligning the first die with a first package substrate. The aligning the first die with the first package substrate includes moving the first package substrate in a first direction and a second direction. The first direction and the second direction are contained in a first plane parallel to the first loop. The method further includes placing the first die over the first package substrate during the first loop.

20 Claims, 7 Drawing Sheets

Related U.S. Application Data continuation-in-part of application No. 13/290,855, filed on Nov. 7, 2011, now Pat. No. 8,546,802.

(51) Int. Cl.
*B23K 1/20* (2006.01)
*B23K 3/08* (2006.01)
*B23K 3/047* (2006.01)
*H01L 21/67* (2006.01)

(52) U.S. Cl.
CPC ........ *B23K 3/082* (2013.01); *H01L 21/67144* (2013.01); *H01L 24/75* (2013.01); *H01L 24/81* (2013.01); *H01L 24/95* (2013.01); *H01L 2224/16225* (2013.01); *H01L 2224/16227* (2013.01); *H01L 2224/759* (2013.01); *H01L 2224/7565* (2013.01); *H01L 2224/7598* (2013.01); *H01L 2224/75183* (2013.01); *H01L 2224/75702* (2013.01); *H01L 2224/75753* (2013.01); *H01L 2224/81024* (2013.01); *H01L 2224/81122* (2013.01); *H01L 2224/81169* (2013.01); *H01L 2224/81801* (2013.01); *H01L 2924/00014* (2013.01); *H01L 2924/15311* (2013.01)

(58) Field of Classification Search
USPC ......... 228/49.5, 101, 102, 105, 33, 43, 49.1, 228/19.2; 29/834, 721, 759, 741, 742
See application file for complete search history.

(56) References Cited

U.S. PATENT DOCUMENTS

| | | | |
|---|---|---|---|
| 6,313,653 | B1 | 11/2001 | Takahashi et al. |
| 6,383,844 | B2 | 5/2002 | Mimata et al. |
| 6,839,959 | B1* | 1/2005 | Hosotani ............ H01L 21/67144 29/721 |
| 7,278,203 | B2 | 10/2007 | Aoyama et al. |
| 7,741,601 | B2 | 6/2010 | Noji et al. |
| 7,850,817 | B2 | 12/2010 | Wakabayashi et al. |
| 8,546,802 | B2 | 10/2013 | Hwang et al. |
| 9,105,760 | B2* | 8/2015 | Hwang |
| 2003/0088959 | A1 | 5/2003 | Tsujimoto |
| 2003/0235486 | A1* | 12/2003 | Doherty ............ H01L 21/67733 414/217.1 |
| 2005/0018403 | A1 | 1/2005 | Foo et al. |
| 2010/0143658 | A1 | 6/2010 | Lawrence |
| 2010/0314050 | A1* | 12/2010 | Wong ..................... H01L 24/75 156/538 |
| 2013/0255079 | A1 | 10/2013 | Maijala et al. |
| 2013/0340943 | A1* | 12/2013 | Yoshida ................. H01L 24/74 156/380.9 |

FOREIGN PATENT DOCUMENTS

| | | |
|---|---|---|
| JP | 2006339436 A | 12/2006 |
| WO | 03058708 A1 | 7/2003 |

* cited by examiner

US 9,966,357 B2

PICK-AND-PLACE TOOL FOR PACKAGING PROCESS

This application is a continuation of U.S. patent application Ser. No. 14/040,004, entitled "Pick-and-Place Tool for Packaging Process," filed on Sep. 27, 2013, which is a continuation-in-part of U.S. patent application Ser. No. 13/290,855, entitled "Pick-and-Place Tool for Packaging Process," filed on Nov. 7, 2011, now U.S. Pat. No. 8,546,802 issued Oct. 1, 2013, which applications are incorporated herein by reference.

BACKGROUND

The manufacturing of integrated circuits often involves the bonding of device dies to package substrates. In a typical bonding process, a device die is first picked up from a wafer that has already been sawed into dies. The device die is flipped upside down and placed on a table. A bond head then picks up the flipped device die from the table, and then places the device die on a package substrate. After a plurality of devices dies are placed on a plurality of package substrate of a package substrate strip, the package substrate strip along with the device dies go through a reflow process, so that the device dies are bonded to the package substrates.

The accuracy in the placement of the device die on the package substrate needs to be well controlled to maintain the yield of the bonding process. On the other hand, the throughput of the pick-and-place process also needs to be improved. However, the requirement in the accuracy of the placement conflicts with the requirement of the increasing the throughput. For example, to improve the throughput, the moving speed of the bond head needs to be increased. However, the increased moving speed results in the sacrifice in the accuracy of the placement. Although multiple bond heads may be used for picking and placing the device dies, each of the multiple bond heads needs to wait for the work space used by other bond heads to be cleared before it can be put into work. The improvement in the throughput is thus limited.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A pick-and-place tool for packaging integrated circuits and the method of using the tool are provided in accordance with various embodiments. The variations and the operation of the embodiments are discussed. Throughout the various views and illustrative embodiments, like reference numbers are used to designate like elements.

Figure 1:
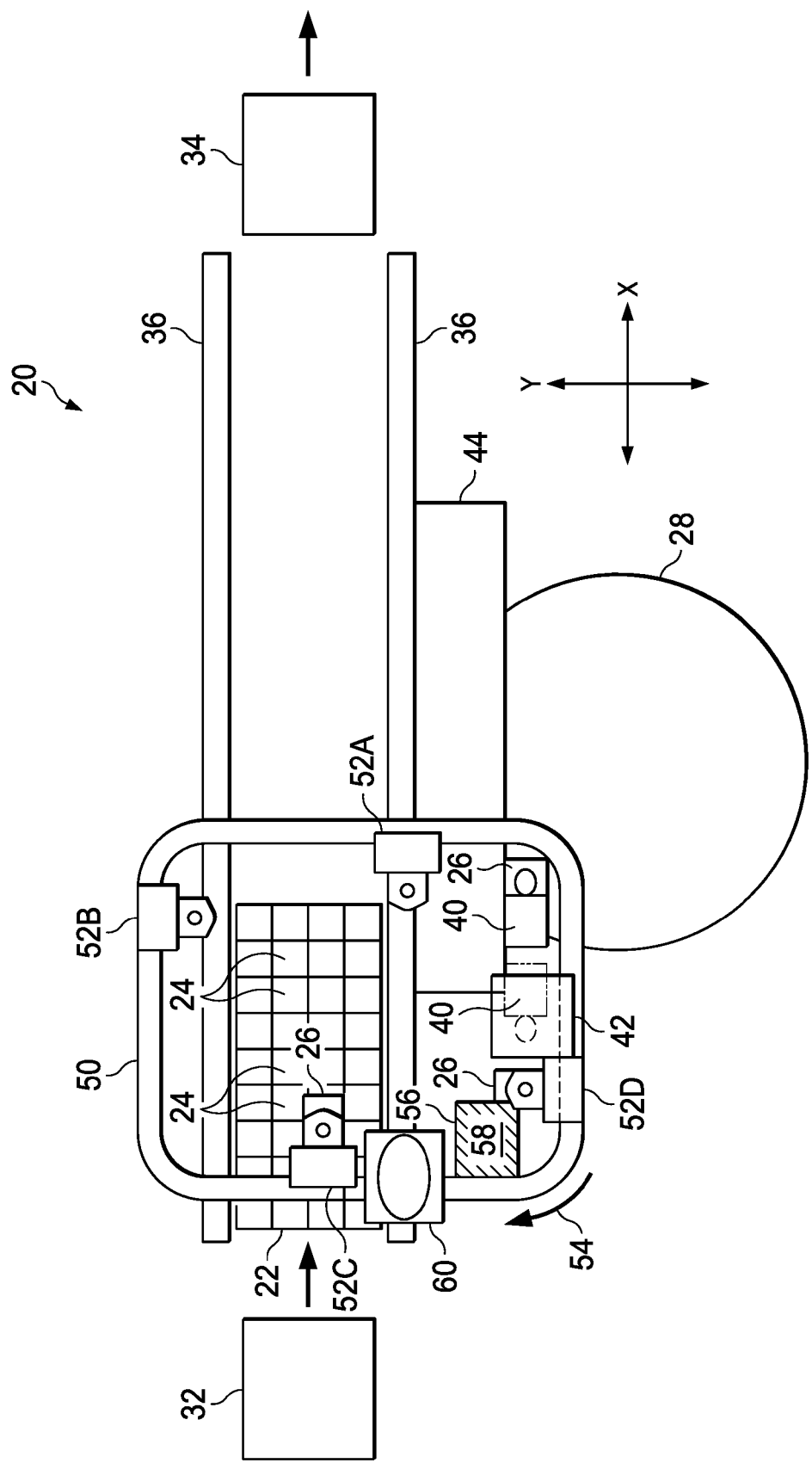
FIGS. 1 through 3 are top views of intermediate stages in the pick-and-place process of dies in accordance with various embodiments, wherein a plurality of bond heads are installed on a guide ring.

FIG. 1 illustrates a top view of pick-and-place tool 20 in accordance with embodiments. Pick-and-place tool 20 is used for placing dies 26 in wafer 28 (please also refer to FIG. 7) onto package components 24, which are collectively in package component strip (or wafer) 22. In some embodiments, package components 24 are package substrates, and hence are referred to as package substrates 24 hereinafter, although they may be another type of package components such as interposers. Package component strip/wafer 22 may be a package substrate strip. Accordingly, package component strip/wafer 22 is alternatively referred to as package substrate strip 22 throughout the description, although package component strip/wafer 22 may also be of other forms such as an interposer wafer. Package component strip/wafer 22 may have a rectangular top-view shape as illustrated in FIG. 1. Alternatively, package component strip/wafer 22 may have other top-view shapes such as a circular shape.

Loader 32 is disposed on a first end of load guides 36, and is configured to load package substrate strip 22 into pick-and-place tool 20, so that package substrate strip 22 may be transferred along load guides 36. After placed with dies 26 thereon, package substrate strips 22 may be unloaded from pick-and-place tool 20 by unloader 34, and sent for subsequent process steps such as reflow.

Figure 7:
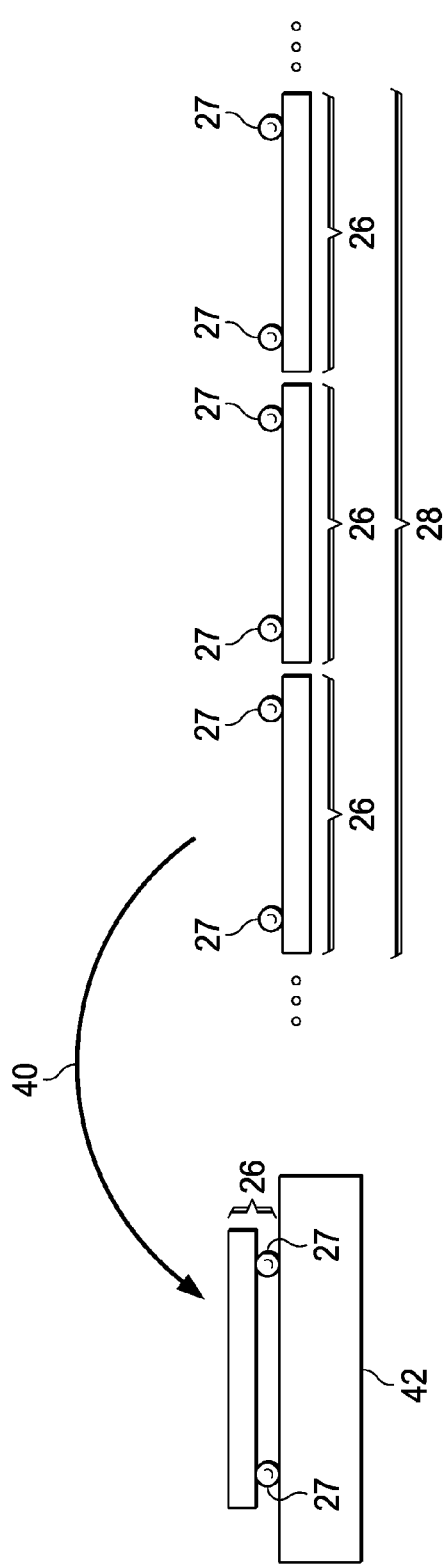
FIG. 7 illustrates a cross-sectional view in the picking of a die from a wafer, and the flipping of the die.

Wafer 28 may be a device wafer, and dies 26 in wafer 28 may be device dies including integrated circuit devices (such as transistors) therein. FIG. 7 illustrates a cross-sectional view of a portion of wafer 28. Dies 26 that are in wafer 28 may be placed with electrical connectors 27 facing up, wherein electrical connectors 27 are to be placed on, and bonded to, package substrates 24 in subsequent process steps (please refer to FIG. 8). Dies 26 have been sawed apart, and hence may be pickup up and placed individually.

Flipper 40 as in FIG. 1 is used to pick up dies 26 one-by-one and flip dies 26, so that connectors 27 (FIG. 7) of dies 26 may face down for the subsequent bonding process. The flipping step is schematically illustrated in FIG. 1. The flipper 40 shown in solid lines illustrates the position of flipper 40 for picking up die 26 from wafer 28, while the flipper 40 shown in dotted lines illustrates the position of the same flipper 40 for dropping flipped die 26 on table 42. FIG. 7 schematically illustrate the positions of die 26 before and after flipping, wherein the arrow represents the flipping step.

Flipper 40 may then place the flipped die 26 on table 42, as shown in FIGS. 1 and 7. As shown in FIG. 1, flipper 40 is installed on flipper guide 44, and may slide back and forth (in the illustrated X directions). Wafer 28 may be moved in the X and Y directions, so that each time, one of dies 26 in wafer 28 is moved to directly under flipper 40, and hence can be picked up and flipped by flipper 40.

Guide ring 50 is installed over load guides 36. A plurality of bond heads 52 (denoted as 52A through 52D) are installed on guide ring 50. Although four bond heads 52 are illustrated as an example, in alternative embodiments, there may be a single one, two, three, or more than four bond heads installed on guide ring 50. Guide ring 50 forms a full ring, so that when bond heads 52 are moved in one direction (such as the direction of arrow 54), bond heads 52 may move continuously along guide ring 50 in a plurality of loops. Bond heads 52A through 52D may move independently and the actions (such as stopping, moving, accelerating, and decelerating) of each of bond heads 52A through 52D may be controlled independently from the actions of other bond heads 52. Bond heads 52A through 52D generally move in the same forward direction as shown by the direction of arrow 54, and are configured not to have substantial backward movement in the direction opposite to the direction of arrow 54. However, optionally, bond heads 52A through 52D may have slight backward movement for the adjustment of positions such as when bond heads 52A through 52D are aligned to table 42, flux tank 56 (which may be a modular flux tank), and alignment tool 60. The actions of bond heads 52A through 52D may be controlled and synchronized by a same control unit (not shown), which may be electrically connected to bond heads 52A through 52D, and configured to control the actions of alignment tool 60, the movement of wafer 28, and the movement of package substrate strip 22.

Figure 2:
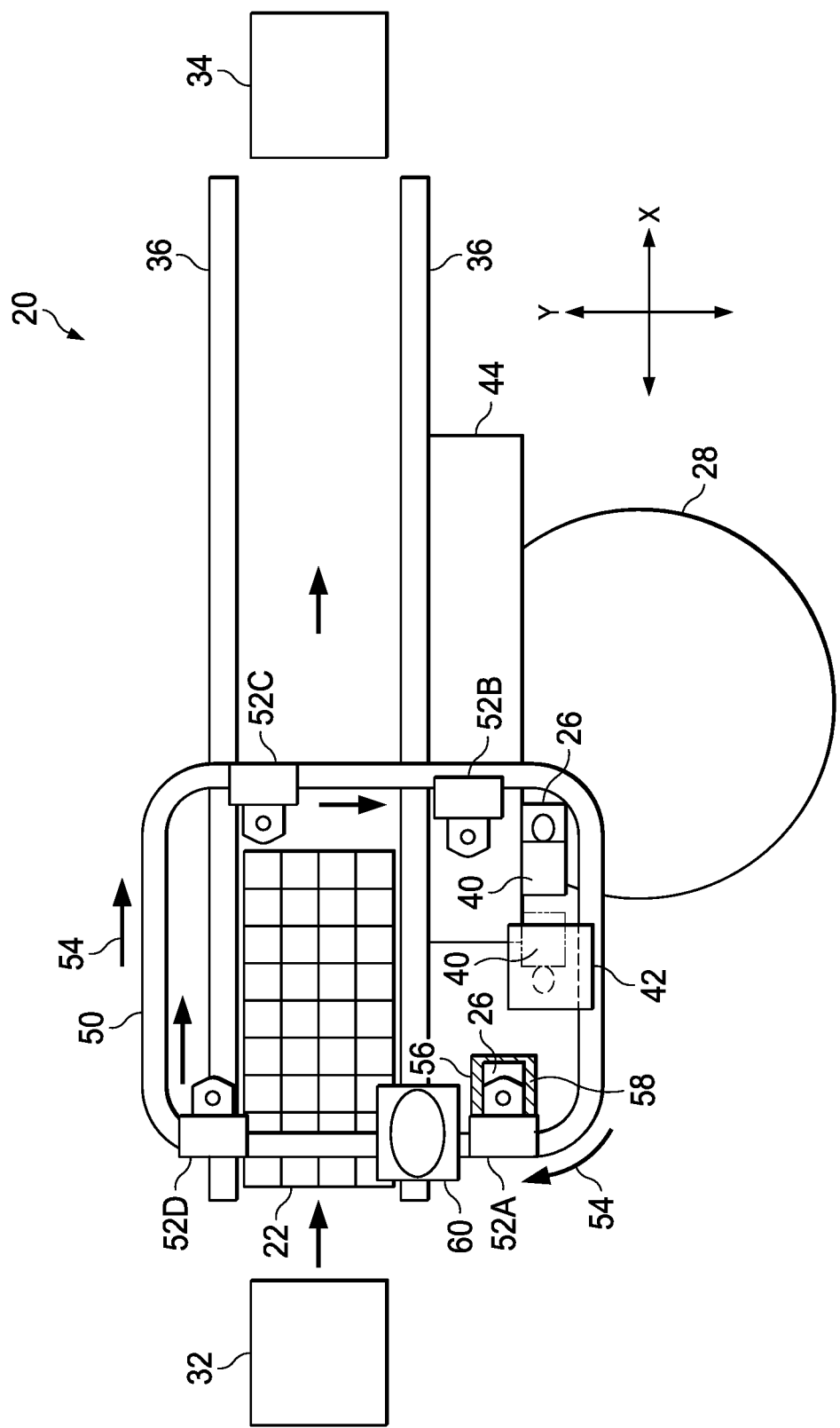
Figure 3:
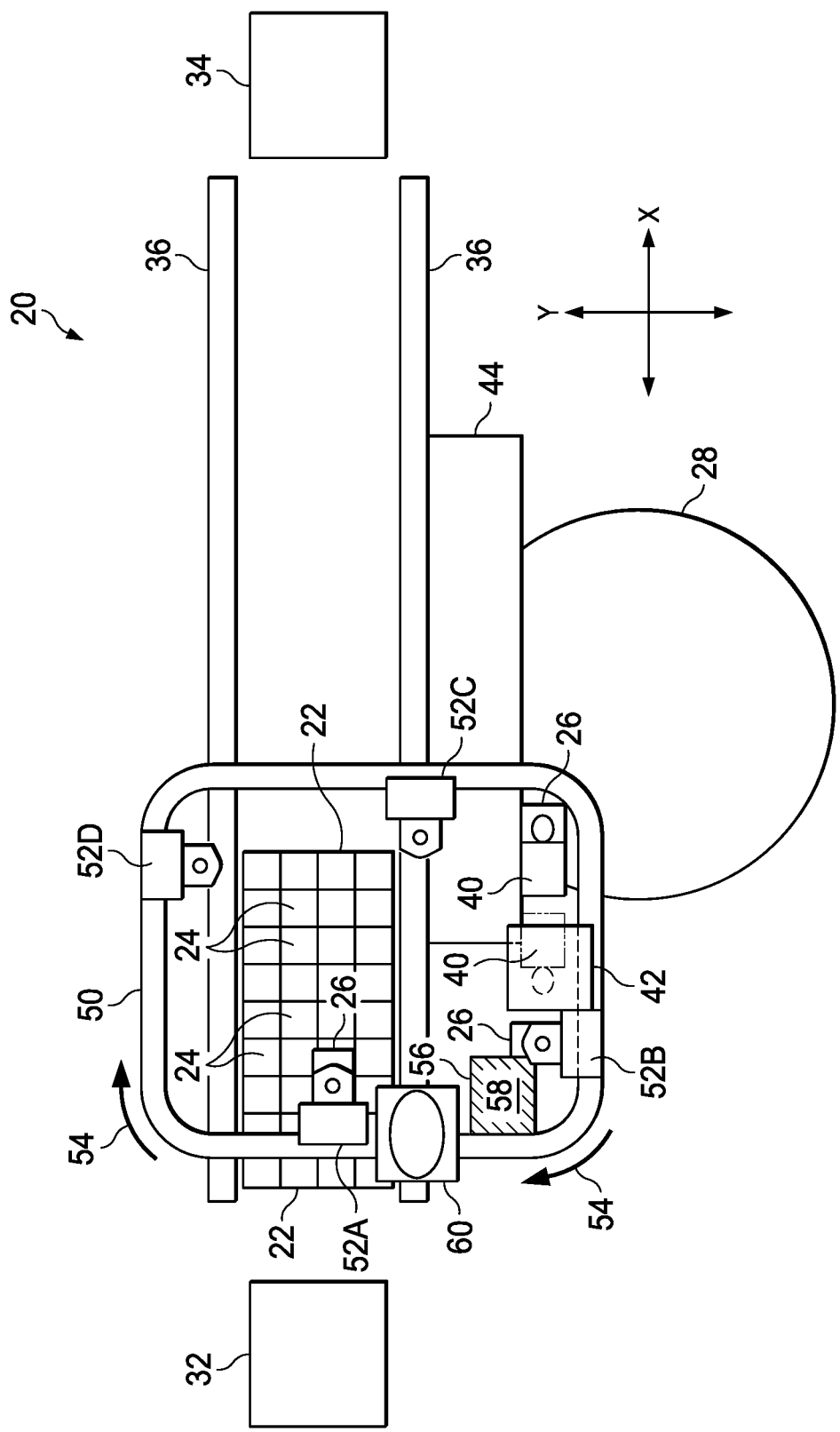

An exemplary pick-and-place process is shown in FIGS. 1 through 3, and is briefly described as follows. First, as shown in FIG. 1, flipper 40 picks up one of dies 26 from wafer 28, glide to the position of table 42, and drops the flipped die 26 onto table 42. Next, as shown in FIG. 2, bond head 52A moves forward along guide ring 50 to the position of table 42, and picks up die 26. Bond head 52A may be a vacuum head that picks up die 26 through vacuuming. Bond head 52 then moves forward to flux tank 56, which contains flux 58 therein (please also refer to FIG. 1). Bond head 52A then dips the front side of die 26 in flux 58, so that connectors 27 (not shown in FIG. 2, please refer to FIG. 7) are dipped with flux 58.

In various alternative embodiments, flux tank 56 may be a modular element 56, which allows the flux tank to be replaced with a different device during applications of pick-and-place tool 20 that do not require the use of flux. For example, in certain applications, dies 26 may be configured to be bonded to package substrates 24 through the use of an adhesive glue layer formed on dies 20 and/or package substrates 24 in lieu of flux. In such cases, the flux tank may be removed, and module 56 may be a different device that aids in the operation of pick-and-place tool 20.

Module 56 may be any applicable device such as a charge coupled device (CCD), an infrared heating device, or another applicable device. A CCD may be used as a pattern recognition device, e.g., that aids alignment tool 60 in aligning dies 26 with respective package substrates 24. Infrared heating devices may be used to transfer heat to layers in dies 26 and/or package substrates 24. For example, an infrared heating device may be used to reduce the viscosity and/or increase the adhesive strength of one or more glue layers. In other alternative embodiments, module 56 may not be a modular flux tank, and pick-and-place tool 20 may comprise other modules (e.g., a CCD, an infrared heating device, or the like) in addition to flux tank 56.

Figure 8:
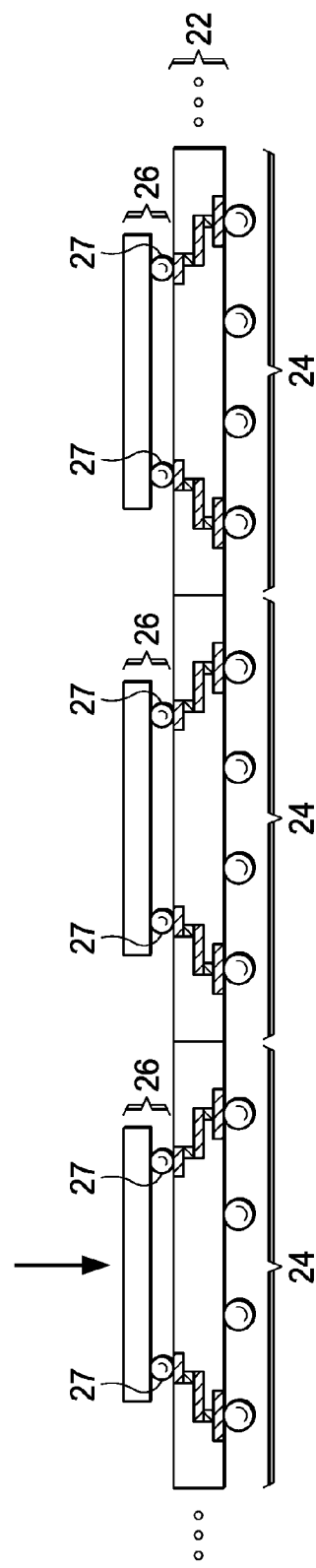
FIG. 8 illustrates a plurality of dies placed on a plurality of package substrates of a package substrate strip.

Bond head 52A then moves to alignment tool 60, which is configured to scan die 26 and help determine the X and Y coordinates and the angle of die 26. In the case that die 26 is not aligned accurately to X and Y directions, bond head 52A may also rotate die 26 slightly in the plane parallel to the X and Y directions until die 26 is accurately aligned to the X and Y directions. Bond head 52A then moves forward to over package substrate strip 22, and place die 26 on a desirable one of package substrates 24. At the time package substrate strip 22 is loaded, the positions of package substrates 24 have been scanned, and the exact position of each of package substrates 24 is known. Accordingly, package substrate strip 22 may be moved in the X and Y directions, so that die 26 is aligned to and accurately placed on the respective package substrate 24. FIG. 8 illustrates a cross-sectional view of dies 26 placed on package substrates 24.

Next, as shown in FIG. 3, after the placement of die 26, bond head 52A continues the movement in the direction of arrow 54. At the same time that bond head 52 performs the actions of picking up die 26, dipping die 26 in flux 58, aligning die 26, and placing die 26 on one of package substrates 24, flipper 40 picks up and flips other dies 26 and places dies 26 on table 42 one-by-one. Alternatively, in operations where flux is not needed (e.g., when die 26 is not configured to be bonded to package substrates 24 with flux), bond head 52 may not dip die 26 in flux. In such cases, module 56 may be used for a different purpose (e.g., to aid alignment or to transfer heat). For example, module 56 may be an infrared heating device, and bond head 52 may transfer die 26 through module 56 to improve the viscosity of a glue layer in die 26 and/or to improve the adhesive strength of subsequently formed bonds. In the meantime, bond heads 52B, 52C, and 52D also move forward, and perform essentially the same actions as bond head 52A as shown in FIGS. 1 through 3. Bond heads 52A through 52D loop on guide ring 50, and in each loop, each of bond heads 52A through 52D picks and places one die 26, until all package substrates 24 in package substrate strip 22 has one of dies 26 placed thereon. Package substrate strip 22 is then transported to the right, and is unloaded from pick-and-place tool 20 by unloader 34.

It is observed that in the above-described process, bond heads 52 move in one direction, and do not need to move back and forth, this saves the back traveling time. Particularly, without the back traveling, bond heads 52 do not need to wait for each other for the clearance of the work space used by other bond heads 52. The efficiency in the pick-and-place of the dies is thus improved.

Figure 4:
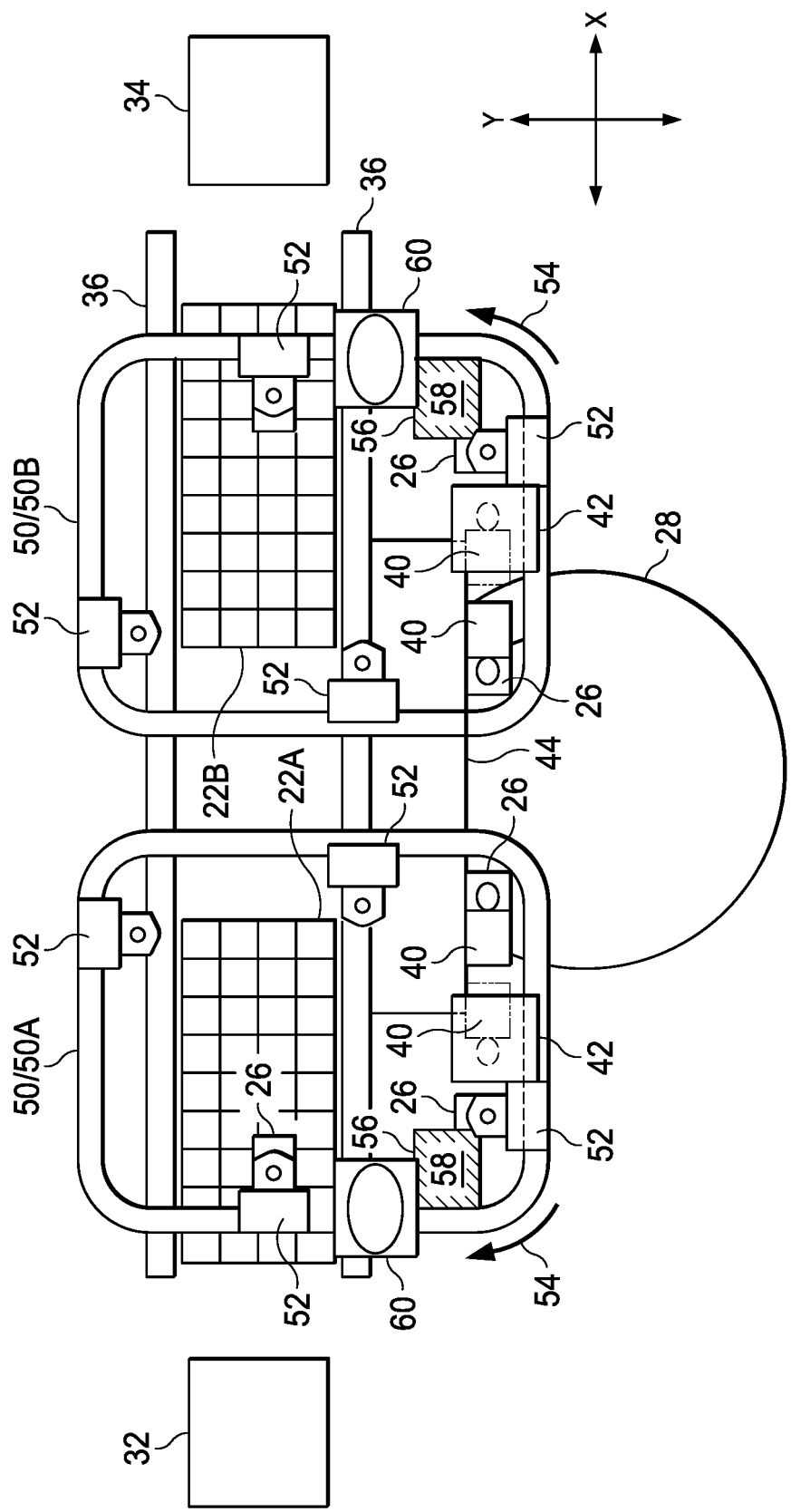
FIG. 4 illustrates a top view of an intermediate stage in the pick-and-place process of dies in accordance with alternative embodiments, wherein a plurality of bond heads are installed on each of two guide rings.

FIG. 4 illustrates pick-and-place tool 20 in accordance with alternative embodiments. These embodiments are similar to the embodiments shown in FIG. 3, except there are two guide rings 50 (including 50A and 50B) in pick-and-place tool 20. Each of guide rings 50 has one or a plurality of bond heads 52 installed thereon. Furthermore, there may be two flippers 40, each serving the bond heads 52 that are installed on one of guide rings 50. The bond heads 52 on each of guide rings 50 are responsible for placing dies 26 on one of package substrate strips 22A and 22B. Again, wafer 28 may be moved in X and Y directions, so that dies 26 may be moved to directly under the flippers 40 that are about to pick dies 26. Each of package substrate strips 22A and 22B may be movable in X and Y directions so that the respective package substrates 24 may be moved to directly under the respective bond heads 52 that are about to place dies 26. The operation of bond heads 52 on each of guide rings 50 is essentially the same as shown in FIGS. 1 through 3.

Figure 5:
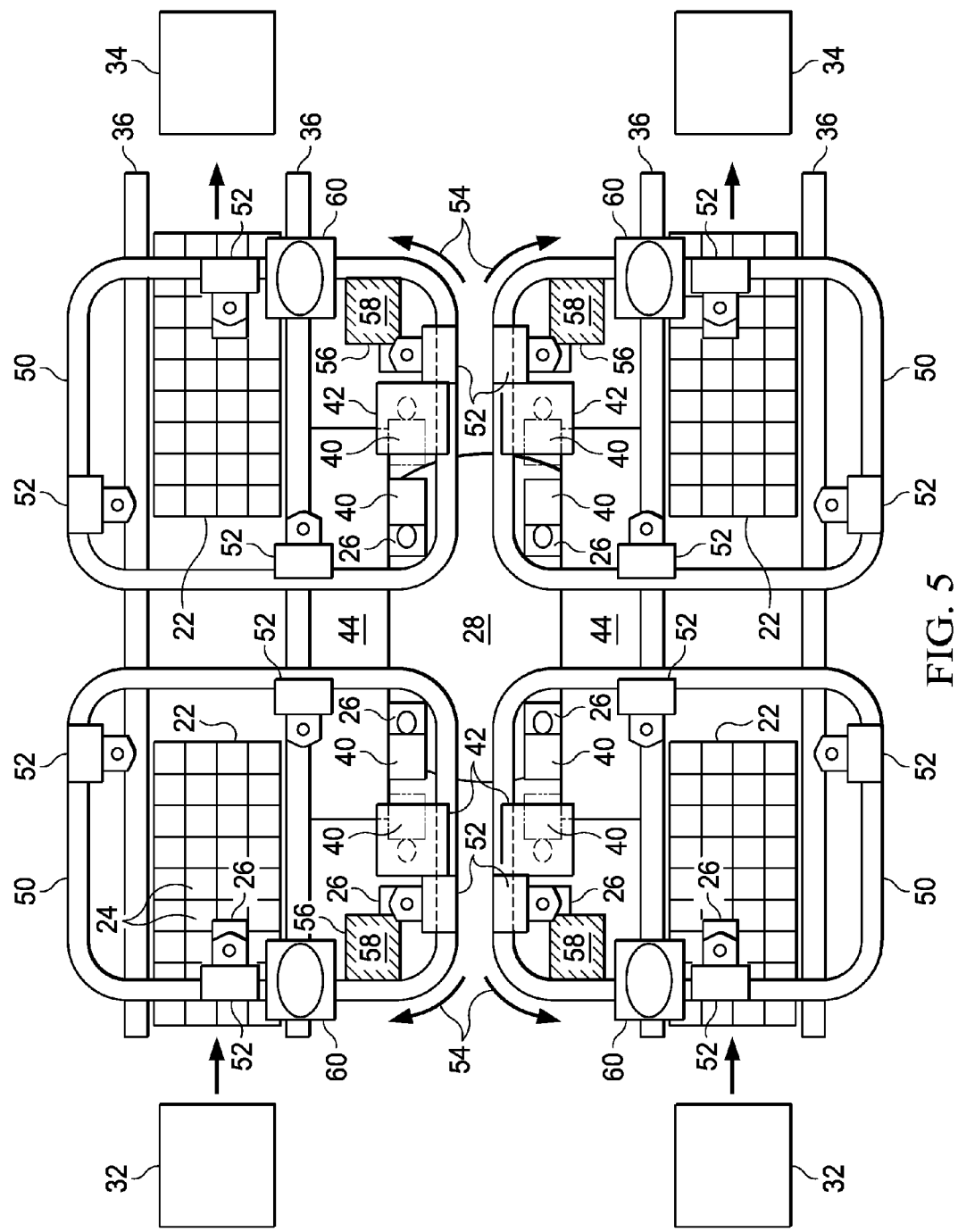
FIG. 5 illustrates a top view of an intermediate stage in the pick-and-place process of dies in accordance with alternative embodiments, wherein a plurality of bond heads are installed on each of four guide rings.

FIG. 5 illustrates pick-and-place tool 20 in accordance with alternative embodiments. These embodiments are similar to the embodiments in FIGS. 1 through 4, except there are four guide rings 50 (including 50A through 50D) in pick-and-place tool 20. Each of guide rings 50 has one or a plurality of bond heads 52 installed thereon. The operation of each of bond heads 52 on each of guide rings 50 may be essentially the same as shown in FIGS. 1 through 3, and hence are not repeated herein. In FIG. 5, two guide rings 50 may share a set of loader 32 and unloader 34 and a set of load guides 36. By using the embodiments in FIGS. 4 and 5, the interface tools such as loader 32, unloader 34, the tools for controlling the movement of wafer 28, and the like, may be shared between a plurality of guide rings 50, and the cost of tools and the work space for deploying the tools are saved.

Figure 6:
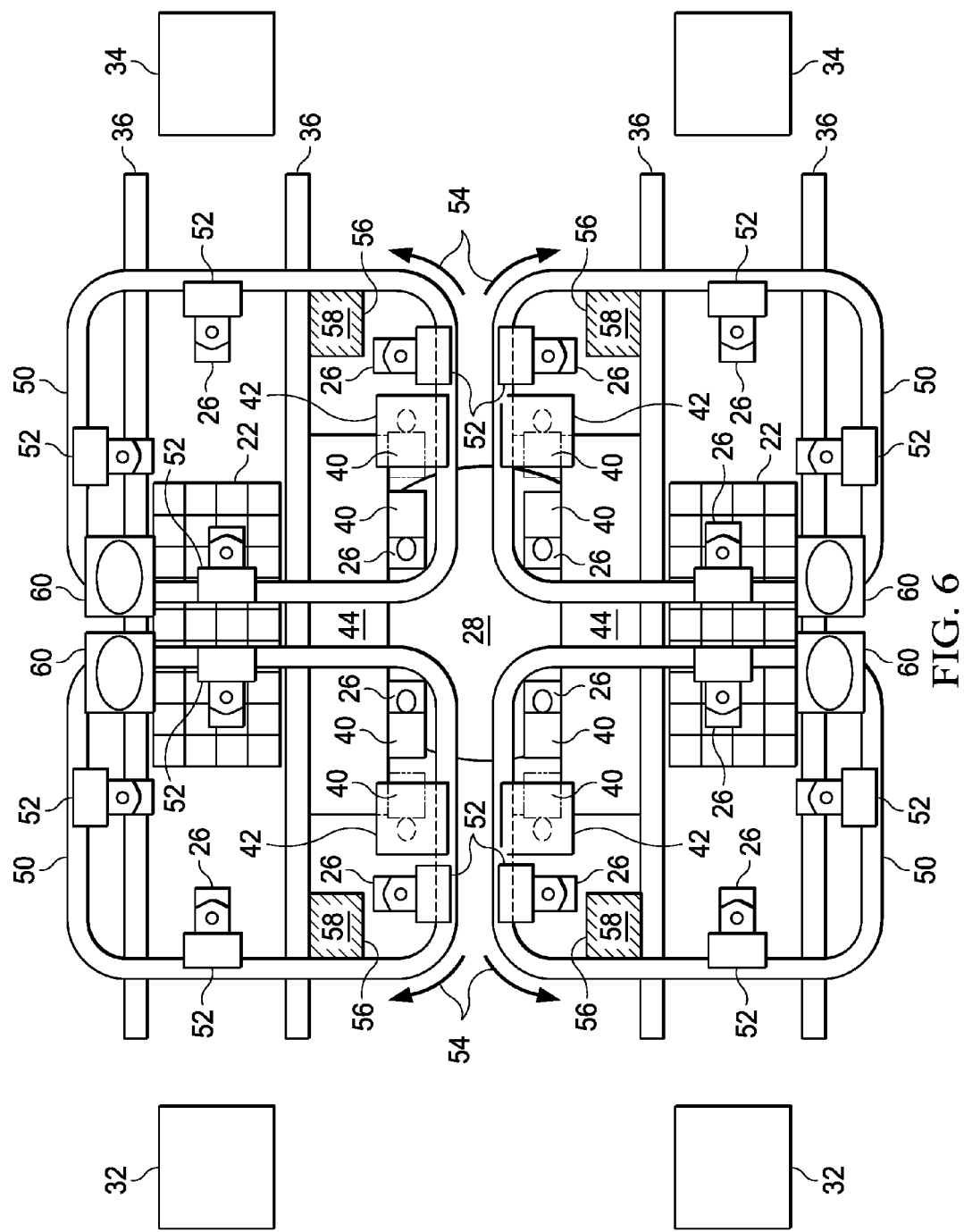
FIG. 6 illustrates a top view of an intermediate stage in the pick-and-place process of dies in accordance with alternative embodiments, wherein bond heads on two neighboring guide rings are used to bond dies onto a same package substrate strip.

FIG. 6 illustrates pick-and-place tool 20 in accordance with yet alternative embodiments. These embodiments are similar to the embodiments in FIG. 5, except bond heads 52 on two neighboring guide rings 50 are configured to bond dies onto the same package substrate strip 22. In these embodiments, the bond heads 52 on the left guide ring 50 may be responsible for bonding dies 26 on the left half of the respective package substrate strip 22, while the bond heads 52 on the right guide ring 50 may be responsible for bonding dies 26 on the right half of the respective package substrate strip 22. The actions of bond heads 52 and the movement of package substrate strip 22 may be coordinated by a control unit (not shown).

In the embodiments, by using guide rings rather than straight guides to guide the movement of bond heads, the bond heads may loop in a single direction, rather than move back and forth. The multiple bonds heads thus do not need to wait for each other. Furthermore, with the multiple bond heads, the moving speed of each of the bond heads may be low, and hence the accuracy of the pack-and-pick process is high. In the meanwhile, the throughput of the place-and-pick is not sacrificed due to the efficient use of the multiple bond heads.

In accordance with embodiments, a method includes moving a first bond head along a first guide apparatus for a first loop. The first guide apparatus is configured in a ring shape. The method also includes picking up a first die using the first bond head during the first loop, and aligning the first die with a first package substrate. The aligning the first die with the first package substrate includes moving the first package substrate in a first direction and a second direction. The first direction and the second direction are contained in a first plane parallel to the first loop. The method further includes placing the first die over the first package substrate during the first loop.

In accordance with other embodiments, an apparatus comprises a first guide apparatus configured in a ring shape and a bond head installed on the first guide apparatus. The bond head is configured to move on the first guide apparatus in a loop. The apparatus further comprises a modular device adjacent the guide apparatus. The modular device is configured to be one of a plurality of pre-determined devices used in a pick-and-place tool.

In accordance with yet other embodiments, a method includes attaching a plurality of bond heads to a ring-shaped guide apparatus, and moving the plurality of bond heads in a loop along the guide apparatus. Each of the plurality of bond heads performs a series of operations during movement along the guide apparatus. The series of operations include picking up a die, aligning the die using an alignment tool, and placing the die on a package component. A top surface of the package component is parallel to the loop while the die is placed on the package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    loading a first package substrate onto a load guide, wherein the load guide comprises two rails that are straight and parallel to each other, wherein the first package substrate is loaded at first ends of the two rails, and wherein the load guide is configured to transfer the first package substrate along the two rails from the first ends to second ends of the two rails opposing the first ends;
    picking up a first die from a wafer using a flipper, wherein external connectors of the first die face upward away from the wafer when picked up by the flipper, wherein the flipper is attached to a flipper guide proximate the load guide, and wherein a longitudinal axis of the flipper guide is parallel to the two rails of the load guide;
    moving the flipper along the longitudinal axis of the flipper guide from the wafer to a table, wherein the table is attached to a first guide apparatus disposed over the load guide, wherein the first guide apparatus is configured in a ring shape and overlaps the load guide in a plan view;
    flipping over the flipper such that the external connectors of the first die face downward;
    placing the first die on the table after the flipping;
    moving a first bond head along the first guide apparatus for a first loop, wherein the first bond head is directly attached to the first guide apparatus, wherein the first guide apparatus is configured to be stationary throughout a time when the first bond head moves in a plane parallel to the first loop;
    picking up the first die from the table using the first bond head during the first loop;
    aligning the first die with the first package substrate, comprising:
        moving the first package substrate in a first direction and a second direction, the first direction and the second direction contained in a first plane parallel to the first loop; and
        placing the first die over the first package substrate during the first loop.

2. The method of claim 1, wherein the aligning the first die further comprises:

using an alignment tool to determine an angle of the first die and coordinates of the first die along the first and the second directions.

3. The method of claim 1, wherein the aligning the first die further comprises:
rotating the first bond head in a second plane parallel to the first plane while the first die is attached to the first bond head, the rotating aligning a first edge and a second edge of the first die to the first direction and the second direction, respectively.

4. The method of claim 1, further comprising:
dipping the first die in a flux tank using the first bond head, before the aligning the first die.

5. The method of claim 1, further comprising:
before the aligning the first die, transferring the first die through a modular device using the first bond head, wherein the modular device comprises a device selected from the group consisting essentially of a flux tank, a heating device and an imaging device.

6. The method of claim 1, further comprising:
moving the first bond head along the first guide apparatus for a second loop;
picking up a second die using the first bond head during the second loop; and
placing the second die over a second package substrate during the second loop.

7. The method of claim 1, further comprising:
at a time the first bond head is moving along the first guide apparatus for the first loop, moving a second bond head along the first guide apparatus for an additional loop, wherein the first bond head and the second bond head move in a same direction;
picking up an additional die using the second bond head during the additional loop; and
placing the additional die over an additional package substrate during the additional loop.

8. The method of claim 7, wherein the first bond head and the second bond head move independently at a time when the first bond head and the second bond head move along the first guide apparatus.

9. The method of claim 1, further comprising:
at a time the first bond head is moving along the first guide apparatus for the first loop, moving a second bond head along a second guide apparatus for a second loop, wherein the first guide apparatus and the second guide apparatus are adjacent to a same load guide for loading and unloading the first package substrate, and wherein the second guide apparatus is configured in a ring shape;
picking up an additional die using the second bond head during the second loop; and
placing the additional die over an additional package substrate during the second loop.

10. A method comprising:
loading a package component onto a first end of a load guide, wherein the load guide comprises parallel rails extending from the first end of the load guide to a second end of the load guide opposing the first end, wherein the load guide is configured to transfer the package component from the first end to the second end of the load guide;
picking up a die at a first location using a flipper, wherein external connectors of the die face upward when picked up by the flipper, wherein the flipper is attached to a flipper guide adjacent and parallel to the rails of the load guide;
moving the flipper along the flipper guide from the first location to a second location different from the first location;
turning the flipper over at the second location and placing the die on a table, wherein the external connectors of the die face downward after being placed on the table, wherein the table is attached to a ring-shaped guide apparatus over the load guide;
attaching a plurality of bond heads comprising a first bond head and a second bond head to the ring-shaped guide apparatus;
moving the plurality of bond heads in a loop along the ring-shaped guide apparatus, each of the plurality of bond heads performing a series of operations during movement along the ring-shaped guide apparatus, wherein while the first bond head and the second bond head are moving along the ring-shaped guide apparatus, a first movement of the first bond head in a plane parallel to the loop is independent of a second movement of the second bond head in the plane parallel to the loop, wherein the series of operations comprise:
picking up the die from the table;
aligning the die using an alignment tool; and
placing the die on the package component, a top surface of the package component being parallel to the loop while the die is placed on the package component; and
unloading the package component from the second end of the load guide after placing the die on the package component.

11. The method of claim 10, wherein the series of operations further comprises:
after picking up the die, dipping a front side of the die in a flux tank proximate the ring-shaped guide apparatus.

12. The method of claim 10, wherein the series of operations further comprises:
after picking up the die, transferring the die through an infrared heating device.

13. The method of claim 10, wherein the aligning the die using an alignment tool further comprises:
using a pattern recognition device to assist the alignment tool in aligning the die.

14. A method comprising:
loading a first package substrate to a first end of a load guide, wherein the load guide comprises two parallel rails extending from the first end of the load guide to a second end of the load guide opposing the first end, wherein the load guide is configured to move the first package substrate from the first end to the second end of the load guide along the rails;
picking up a first die at a first location using a flipper;
moving the flipper along a direction parallel to the rails to a second location different from the first location;
flipping over the flipper, wherein flipping over the flipper flips the first die upside down;
after flipping over the flipper, placing the first die on a table attached to a first guide apparatus, wherein the first guide apparatus overlies the load guide;
attaching the first die to a first bond head installed on the first guide apparatus, wherein the first guide apparatus is configured in a ring shape, wherein the first bond head physically contacts the first guide apparatus;
moving the first bond head in a first loop along the first guide apparatus, wherein the first guide apparatus is stationary throughout a period when the first bond head moves along the first guide apparatus in a circle around the first loop;

transferring the first die through a modular device adjacent the first guide apparatus, wherein the modular device is configured to be a flux tank, a heating device, or an imaging device;

placing the first die on the first package substrate using the first bond head; and unloading the first package substrate from the second end of the load guide after placing the first die on the first package substrate.

15. The method of claim 14, further comprising aligning the first die with the first package substrate using an alignment tool before the placing.

16. The method of claim 15, wherein the imaging device is a pattern recognition device, wherein the pattern recognition device aids the alignment tool in aligning dies.

17. The method of claim 14, further comprising:

attaching a second die to a second bond head installed on the first guide apparatus;

moving the second bond head in a second loop along the first guide apparatus, while the first bond head is moving along the first guide apparatus; and placing the second die on the first package substrate using the second bond head.

18. The method of claim 17, wherein the first bond head and the second bond head move in a same direction along the first guide apparatus.

19. The method of claim 14, further comprising:

attaching a second die to a second bond head installed on a second guide apparatus, wherein the second guide apparatus is configured in a ring shape, wherein the first guide apparatus and the second guide apparatus are adjacent to a same load guide;

moving the second bond head in a second loop along the second guide apparatus, while the first bond head is moving along the first guide apparatus; and placing the second die on a second package substrate using the second bond head.

20. The method of claim 14, wherein the moving the first bond head in the first loop comprises:

moving the first bond head in the first loop along the first guide apparatus in a first direction; and adjusting a position of the first bond head by moving the first bond head in the first loop along the first guide apparatus in a second direction opposite the first direction.

\* \* \* \* \*